United States Patent
Tu et al.

(10) Patent No.: US 6,720,571 B1
(45) Date of Patent: Apr. 13, 2004

(54) QUANTUM WELL DEVICE WITH ESD ENDURANCE AND METHOD OF FORMING THE SAME

(75) Inventors: Chuan-Cheng Tu, Tainan (TW); Jen-Chau Wu, Hsinchu (TW); Shiu-Mu Tang, Kaohsiung (TW); Pao-I Huang, Chiai (TW)

(73) Assignee: United Epitaxy Company, Ltd., Hsinchu (TW)

( * ) Notice: Subject to any disclaimer, the term of this patent is extended or adjusted under 35 U.S.C. 154(b) by 74 days.

(21) Appl. No.: 09/643,852

(22) Filed: Aug. 22, 2000

(30) Foreign Application Priority Data

Dec. 2, 1999 (TW) .......................... 88121081 A

(51) Int. Cl.$^7$ ........................................... H01L 29/205
(52) U.S. Cl. ........................................... 257/21; 257/15
(58) Field of Search ..................... 257/15, 21

(56) References Cited

U.S. PATENT DOCUMENTS

| | | | | |
|---|---|---|---|---|
| 5,502,739 A | * | 3/1996 | Kidoguchi et al. | 372/45 |
| 5,521,935 A | * | 5/1996 | Irikawa | 257/18 |
| 5,563,423 A | * | 10/1996 | Wu et al. | 257/17 |
| 5,959,307 A | | 9/1999 | Nakamura et al. | |

FOREIGN PATENT DOCUMENTS

| | | |
|---|---|---|
| EP | 0 210 616 A2 | 2/1987 |
| JP | 09232666 A | 9/1997 |
| JP | 10135573 A | 5/1998 |

OTHER PUBLICATIONS

Mawatari et al., "Spectral Linewidth and Linewidth Enhancement Factor in 1.5$\mu$m Modulation–Doped Strained Multiple–Quantum–Well Lasers," Jpn. J. Appl. Phys., vol. 33 (1994), pp. 811–814.

Shimizu et al., "1.3–$\mu$m InAsP n–Type Modulation–Doped MQW Lasers Grown by Gas–Source Molecular Beam Epitaxy," IEEE Journal of Selected Topics in Quantum Electronics, vol. 5, No. 3, May/Jun. 1999, pp. 449–456.

* cited by examiner

Primary Examiner—Jerome Jackson
(74) Attorney, Agent, or Firm—Birch, Stewart, Kolasch & Birch, LLP

(57) ABSTRACT

The present invention provides a quantum well device and a method of forming the same. The quantum well device comprises alternately stacked n layers of quantum well layers and n layers of barrier layers, wherein the quantum well layers and barrier layers are alternatively doped with dopant, and n is a positive integer. The dopant of a predetermined concentration is applied to control the breakdown voltage and output intensity of the quantum well device and to consequently avoid artificial and mechanical ESD failure.

6 Claims, 11 Drawing Sheets

QUANTUM WELL DEVICE WITH ESD ENDURANCE AND METHOD OF FORMING THE SAME

FIELD OF THE INVENTION

The present invention relates to a quantum well device and a method of forming the same, and more particularly, to a quantum well device with electro-static discharge (ESD) endurance and a method of forming the same.

BACKGROUND OF THE INVENTION

For recent years, a multiple quantum well structure has been extensively applied in the light emitting semiconductor structure. Various improved multiple quantum well structures have been also researched and developed. A modern multiple quantum well structure is frequently applied to a light emitting diode or a laser diode.

FIG. 1 is a schematic diagram of a conventional quantum well device 10. The conventional quantum well device 10 includes a GaAs substrate 12 of a first conductivity type and a GaAs buffer layer 14 on the GaAs substrate 12. An AlGaInP cladding layer 16 of the first conductivity type is formed on the GaAs buffer layer 14. A lower confining layer 18 is formed on the AlGaInP cladding layer 16. An active layer 20 is formed on the lower confining layer 18. An upper confining layer 22 is formed on the active layer 20. An AlGaInP cladding layer 24 of a second conductivity type is formed on the upper confining layer 22. Finally, a cover layer 26 of the second conductivity type is formed on the AlGaInP cladding layer 24, wherein the cover layer 26 is a window layer or an ohmic contact layer.

FIG. 2 is a schematic diagram of the active layer 20 shown in FIG. 1. The active layer 20 of the conventional quantum well device 10 adopts a multiple quantum layers structure which is formed by alternately stacking a plurality of barrier layers 19 and a plurality of quantum well layers 21. Each barrier layer 19 and each quantum well layer 21 are made of undoped AlGaInP.

FIG. 3 is an ESD performance test diagram of the quantum well device 10 shown in FIG. 1. For a long time, ESD problems coming from human-body mode or machine mode have existed in the quantum well device 10. Particularly for the quantum well device 10 having an emitting light wavelength between 570 nm and 650 nm, the accumulated failure percentage of the quantum well device 10 nears almost 100% if a failure voltage resulting from ESD is raised from 0V to 3 kV according to the ESD performance test results. Therefore, U.S. Pat. No. 5,116,767 discloses a laser diode having a passivation layer to improve the electric stress induced by artificial or mechanical ESD. However, the passivation layer places burden over the technology of epitaxy process and increases cost. Therefore it is not widely applied.

SUMMARY OF THE INVENTION

To overcome the above problems, the present invention discloses a quantum well device and a method of forming the same. The quantum well device includes alternately stacked n layers of quantum well layers and n layers of barrier layers, wherein the quantum well layers and barrier layers are alternatively doped with dopant, and n is a positive integer. The quantum well device of the above structure is usually referred to as an active layer in a light emitting device.

The method of forming a quantum well device includes the steps of alternately stacking n layers of quantum well layers and n layers of barrier layers, and during the stacking step, alternatively doping the quantum well layers and barrier layers with dopant, wherein n is a positive integer.

In other embodiments, the quantum well device further includes a substrate, a buffer layer, a lower cladding layer, a lower confining layer, an upper confining layer, an upper cladding layer, and a cover layer.

The dopant of the quantum well device controls the breakdown voltage and output intensity of the quantum well device and consequently avoids artificial and mechanical ESD failure. In embodiments, the dopant is n-type dopant including Te, Se or Si. In another embodiments, the dopant is p-type dopant including Mg, C or Zn. A concentration of the dopant is preferably between $5\times10^6$/c.c and $3\times10^{18}$/c.c.

BRIEF DESCRIPTION OF THE INVENTION

DETAILED DESCRIPTION OF THE INVENTION

Figure 4:
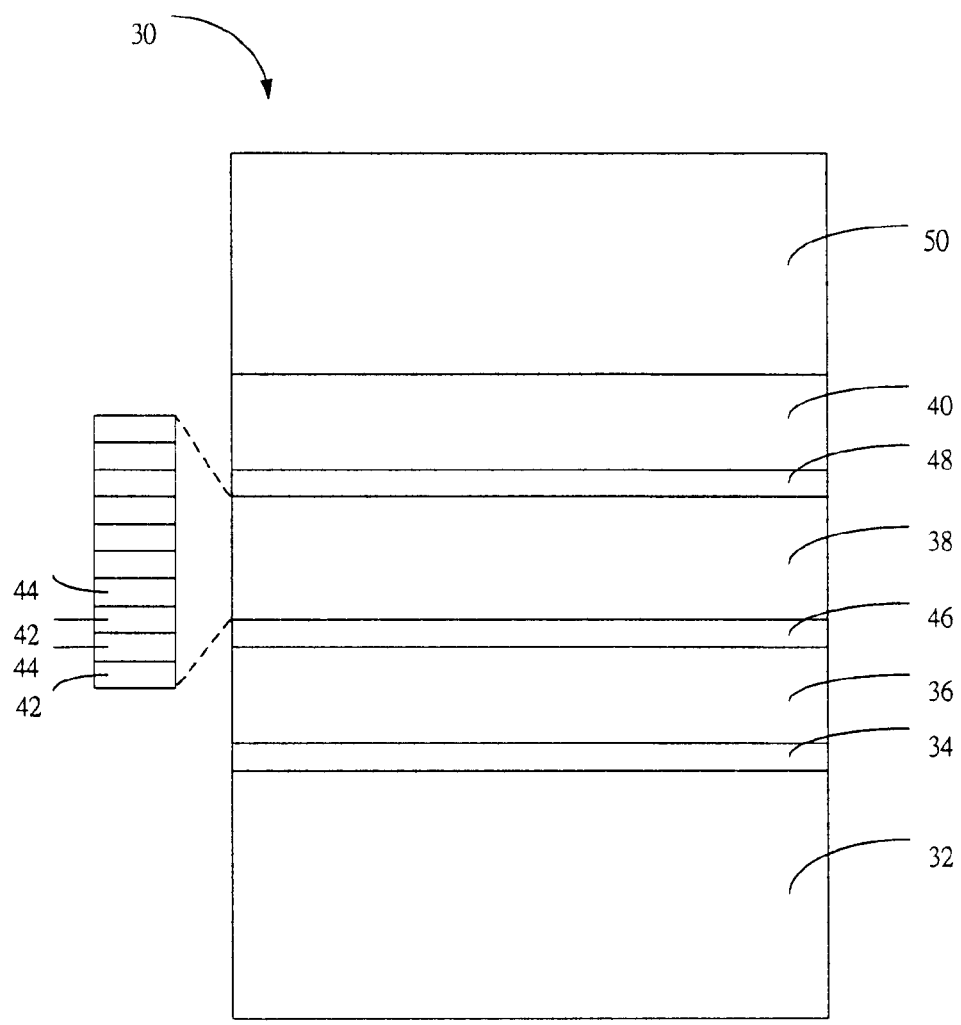
FIG. 4 is a schematic diagram of a quantum well device according to the present invention.

Please refer to FIG. 4, which is a schematic diagram of a quantum well device 30 according to the present invention. The present invention provides a quantum well device 30 which can be utilized in a light emitting device, such as a light emitting diode or a laser diode. The quantum well device 30 includes an active layer 38 which comprises alternately stacked n layers of quantum well layers 42 and n layers of barrier layers 44, wherein the quantum well layers 42 and barrier layers 44 are alternatively doped with dopant, and n is a positive integer.

As indicated above, the quantum well layers and the barrier layers are alternatively doped with dopant. This means that either all the quantum well layers are doped and the barrier layers are undoped, or alternatively the barrier layers are doped and the quantum well layers are undoped. Accordingly, all the layers of one type are doped and all of the layer of the other typed are undoped, so that alternate layers in the stack are doped. Either type of layer can be doped and either n or p-doping can be used.

The dopant is an n-type dopant such as Te, Se or Si, or a p-type dopant such as Mg, C or Zn. A concentration of the dopant is between $5\times10^{16}$/c.c and $3\times10^{18}$/c.c. The active layer 38 is made of $(Al_xGa_{1-x})_{0.51}In_{0.49}P$, wherein x is between 0 and 0.4 and determined by the emitting light wavelength. For example, x is 0.15 if the wavelength of the active layer 38 emitting light is 610 nm.

In other embodiments, the quantum well device 30 further includes a substrate 32. The alternately stacked quantum well layers 42 and barrier layers 44 are disposed on the substrate 32. The substrate 32 is an n-type GaAs substrate or a Ge substrate. Further, the quantum well device 30 includes an n-type lower cladding layer 36 and a p-type upper cladding layer 40. The lower cladding layer 36 is an AlGaInP layer or an AlInP layer being disposed on the substrate 32. The upper cladding layer 40 is an AlGaInP layer or an AlInP layer being disposed on the active layer 38.

The quantum well device 30 further includes a lower confining layer 46 and an upper confining layer 48. The lower confining layer 46 is formed between the lower cladding layer 36 and the active layer 38, and the upper confining layer 48 is formed between the active layer 38 and the upper cladding layer 40. Each one of the lower confining layer 46 and the upper confining layer 48 is an undoped or a doped AlGaInP layer. In the doped AlGaInP layer, the dopant is n-type dopant such as Te, Se or Si, or p-type dopant such as Mg, C or Zn. The dopant concentration is between $5\times10^{16}$/c.c and $3\times10^{18}$/c.c.

The quantum well device 30 further includes a buffer layer 34. The buffer layer 34 is an n-type GaAs layer that is formed between the lower cladding layer 36 and the substrate 32.

In the other embodiment, the quantum well device 30 further includes a cover layer 50 on the upper cladding layer 40. The cover layer 50 is a GaP layer or a GaAs layer. For a light emitting diode, the cover layer 50 is a window layer. For a laser diode, the cover layer 50 is an ohmic contact layer.

Figure 1:
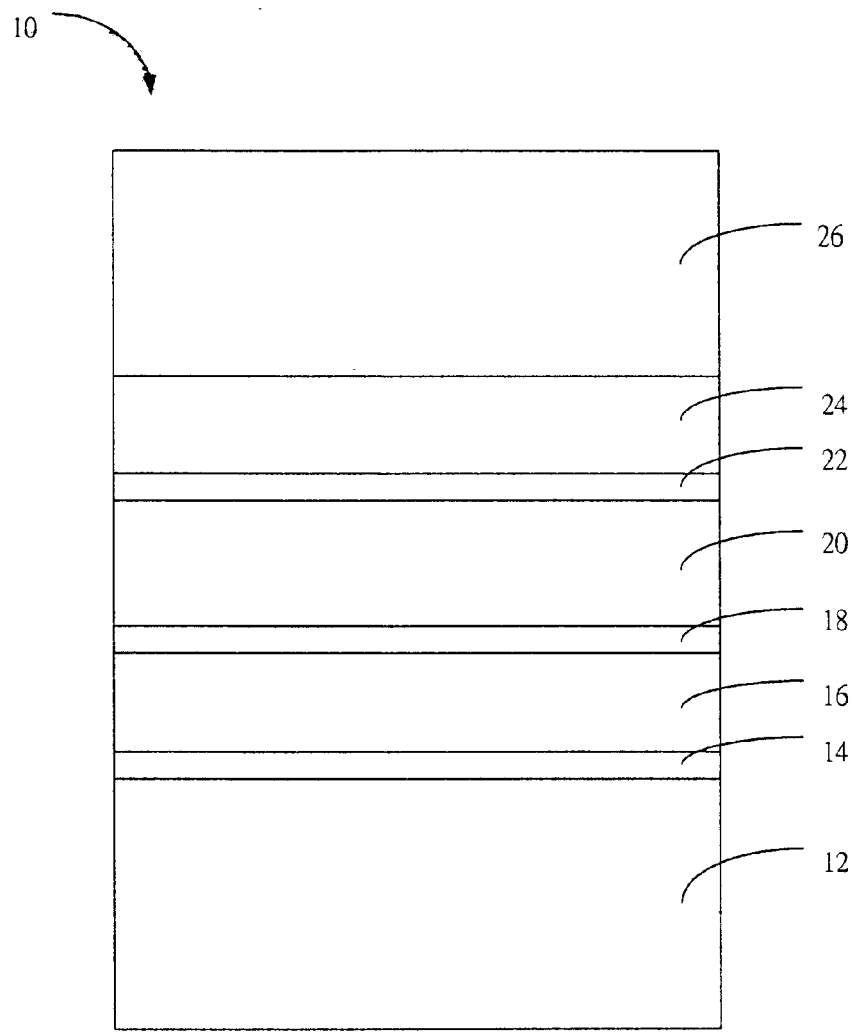
FIG. 1 is a schematic diagram of a conventional quantum well device.
Figure 2:
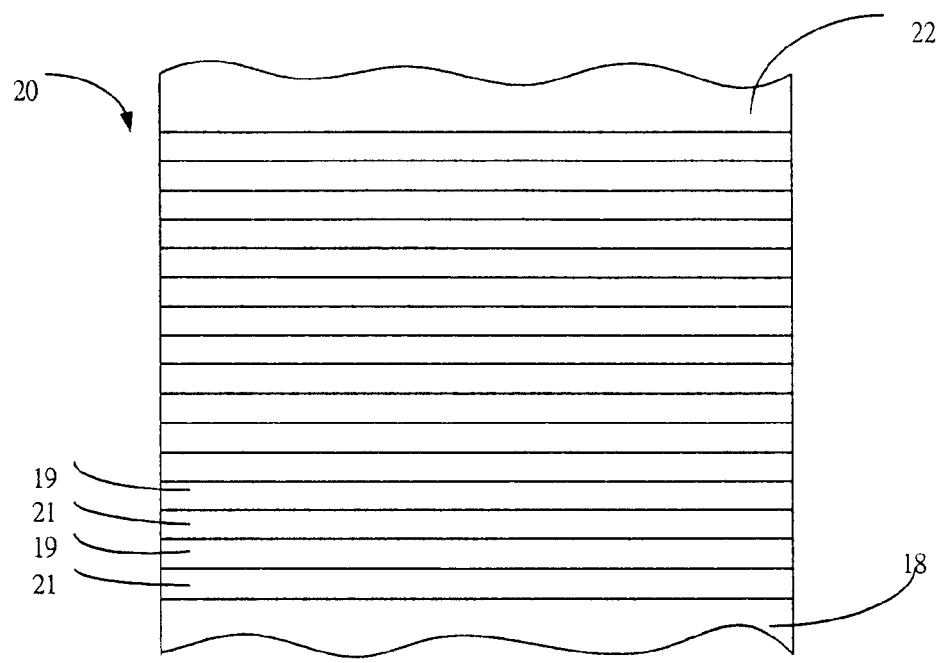
FIG. 2 is a schematic diagram of an active layer shown in FIG. 1.
Figure 3:
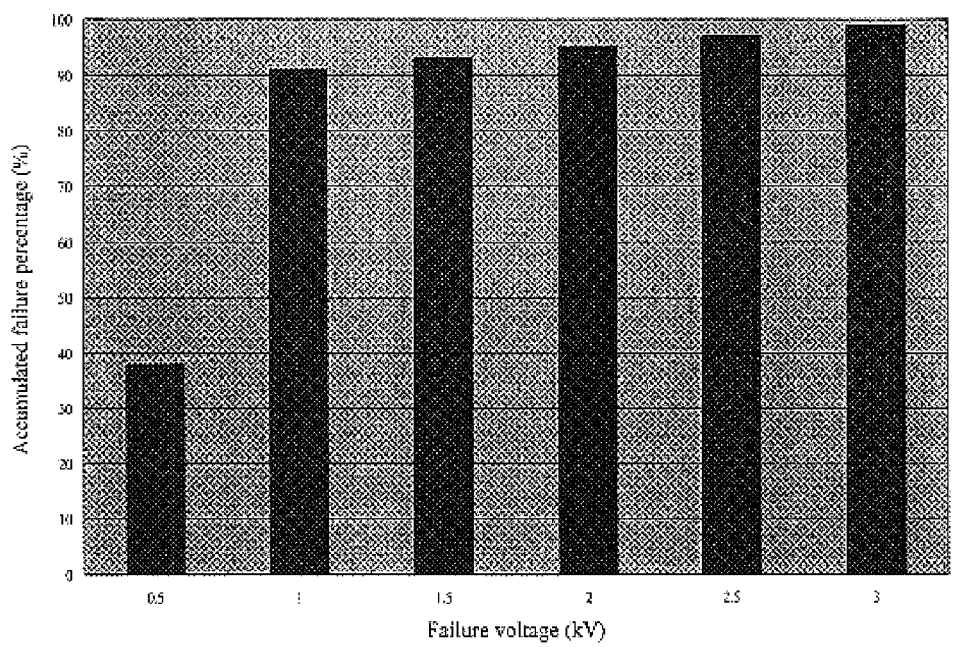
FIG. 3 is an ESD performance test diagram of the quantum well device shown in FIG. 1.
Figure 5:
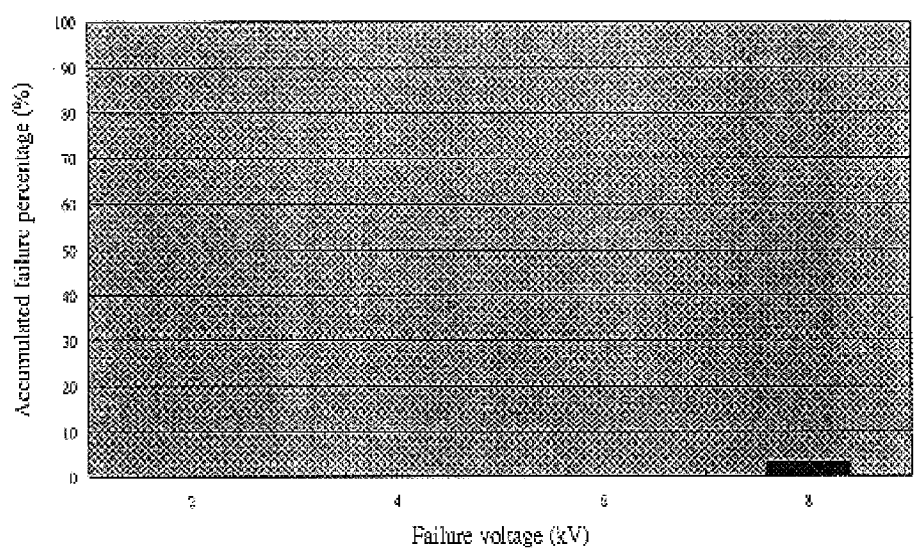
FIG. 5 is an ESD performance test diagram of the quantum well device shown in FIG. 4.

Please refer to FIG. 5. FIG. 5 is an ESD performance test diagram of the quantum well device 30 shown in FIG. 4. The quantum well device 30 of the present invention greatly reduces failure resulted from ESD since the quantum well device 30 comprises a periodic-delta-doped active layer 38. The breakdown voltage and emitting light intensity of the quantum well device 30 are manipulated by the n-type or p-type dopant of a predetermined dopant concentration. The ESD performance test diagram of the conventional quantum well device 10 is shown in FIG. 3. The results of the ESD performance test of the quantum well device 30 according to the present invention show that the failure percentage is merely between 0% and 10% when failure voltage resulted form ESD reaches 8 kV as shown in FIG. 5.

Figure 6:
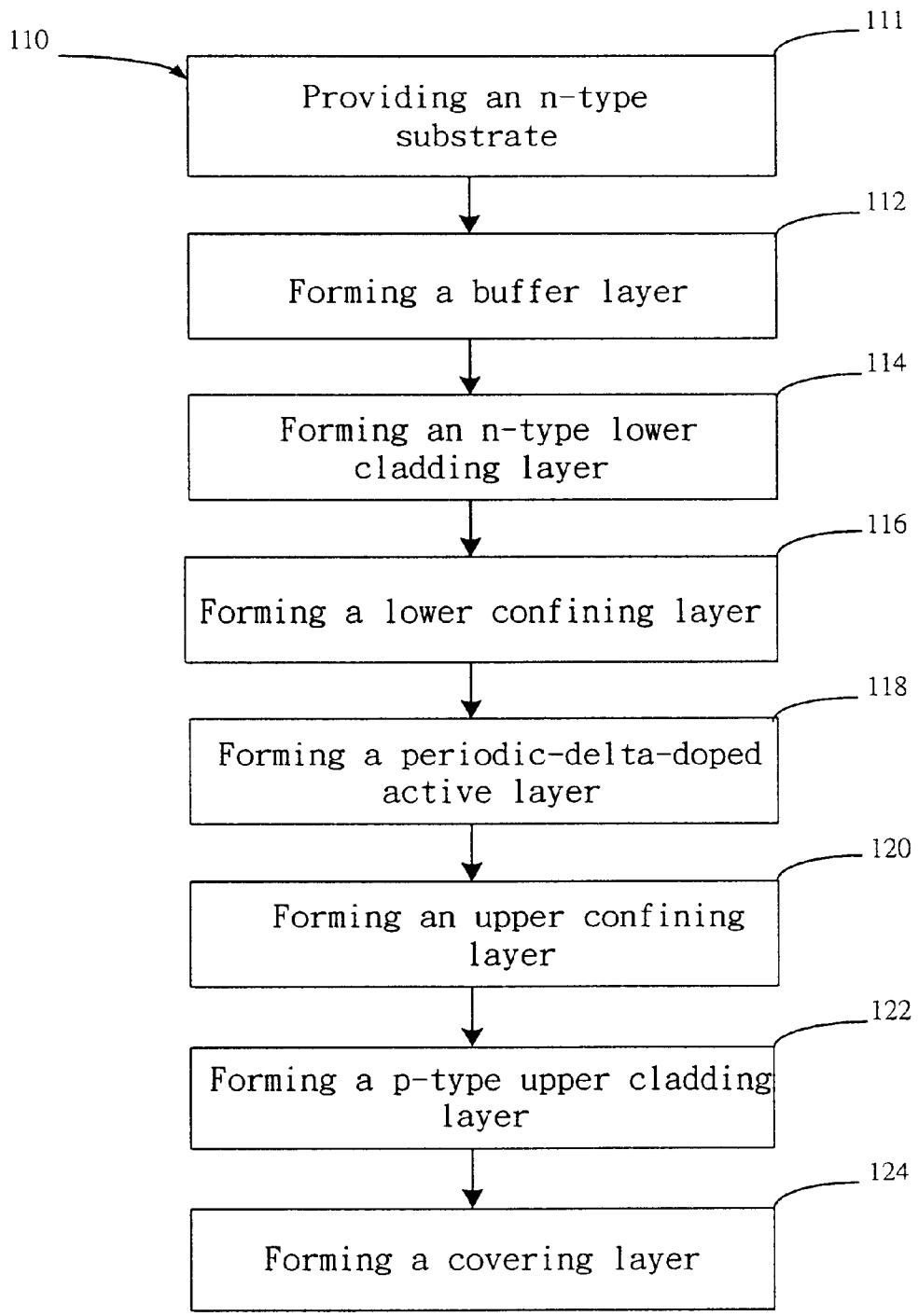
FIG. 6 is a process flow chart of making the quantum well device shown in FIG. 4.
Figure 7:
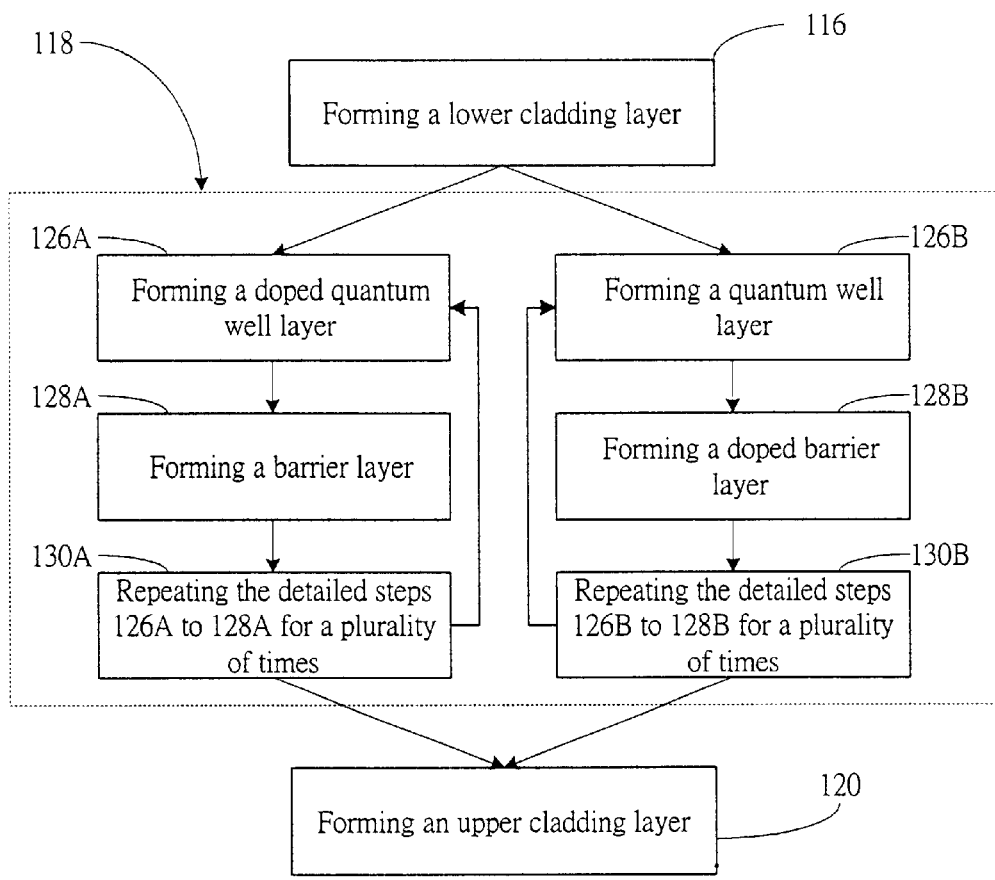
FIG. 7 is a detailed flow chart of the process step 118 in FIG. 6.

Please refer to FIGS. 6 and 7. FIG. 6 is a process 110 flow chart of making the quantum well device 30 shown in FIG. 4. FIG. 7 is a detailed flow chart of the step 118 of the process 110 shown in FIG. 6. The process 110 of making the quantum well device 30 of the present invention comprises the following steps, as shown in FIG. 6:

Step 111: providing an n-type substrate 32;
Step 112: forming a buffer layer 34 on the substrate 32;
Step 114: forming an n-type lower cladding layer 36 on the buffer layer 34;
Step 116: forming a lower confining layer 46 on the n-type lower cladding layer 36;
Step 118: forming a periodic-delta-doped active layer 38 on the lower confining layer 46;
Step 120: forming an upper confining layer 48 on the active layer 38;
Step 122: forming a p-type upper cladding layer 40 on the upper confining layer 48; and
Step 124: forming a cover layer 50 on the p-type upper cladding layer 40.

The step 118 further comprises the following detailed steps, as shown in FIG. 7:

Detailed step 126A: forming a doped quantum well layer 42 on the lower confining layer 46, wherein the dopant of the quantum well layer 42 is an n-type dopant comprising Te, Se and Si, or a p-type dopant comprising Mg, C and Zn, and the dopant concentration is between $5\times10^{16}$/c.c and $3\times10^{18}$/c.c.;
Detailed step 128A: forming a barrier layer 44 on the quantum well layer 42; and
Detailed step 130A: repeating the step 126A to 128A for a plurality of times.

Alternatively, the step 118 may comprise the following detailed steps, as shown in FIG. 7:

Detailed step 126B: forming a quantum well layer 42 on the lower cladding layer 46;
Detailed step 128B: forming a doped barrier layer 44 on the quantum well layer 42, wherein the dopant of the barrier layer 44 is an n-type dopant comprising Te, Se and Si, or a p-type dopant comprising Mg, C and Zn, and the dopant concentration is between $5\times10^{16}$/c.c and $3\times10^{18}$/c.c.; and
Detailed step 130B: repeating the detailed steps 126B to 128B for a plurality of times.

EXAMPLE 1

Figure 8:
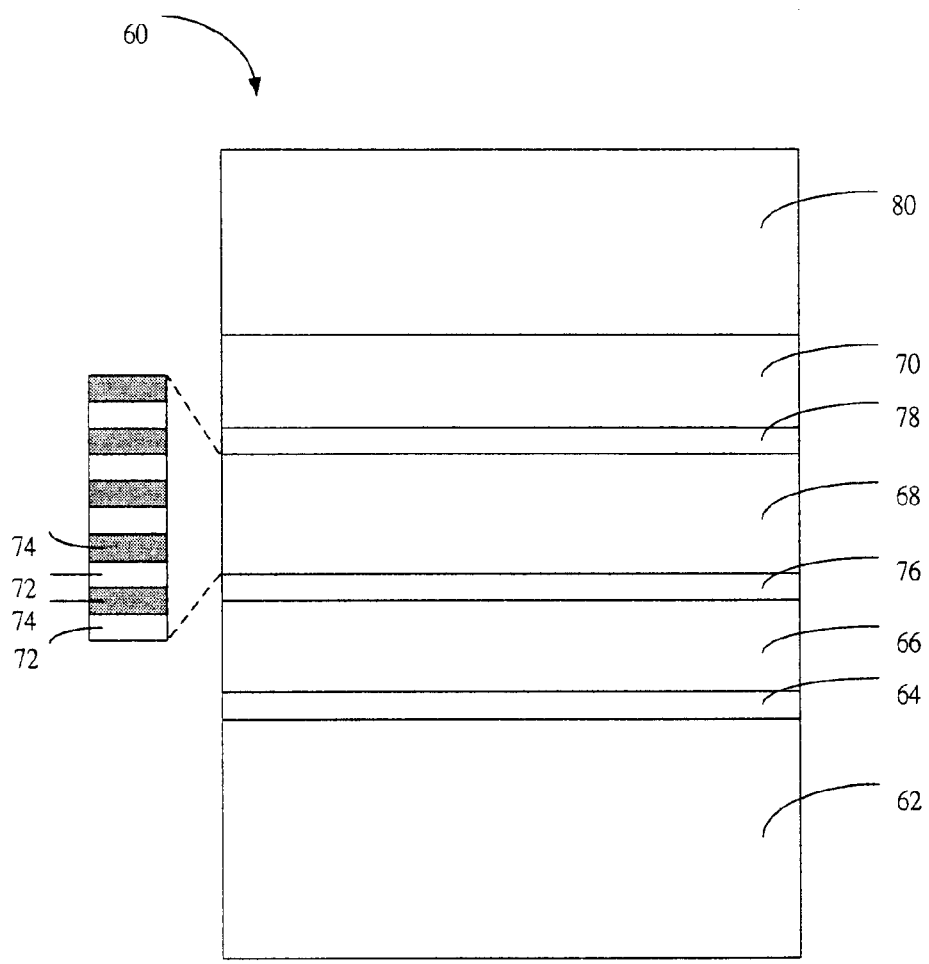
FIG. 8 is a schematic diagram of a light emitting diode of the first embodiment utilizing the quantum well device according to the present invention.

Please refer to FIG. 8. FIG. 8 is a schematic diagram of a light emitting diode 60 of the first embodiment utilizing the quantum well device 30 according to the present invention. The quantum well device 30 of the present invention is applied to a light emitting diode. The light emitting diode 60 is formed on a GaAs substrate 62 which has a (100) principal crystal plane inclined at −2 or +2 degree to (111) plane and has an n-type dopant concentration of $1\times10^{18}$/c.c. The thickness of the GaAs substrate 62 is bout 350 $\mu$m. Firstly, a GaAs buffer layer 64 having an n-type dopant concentration of $1\times10^{18}$/c.c. is formed on the substrate 62. Secondly, an n-type AlInP lower cladding layer 66 is formed on the buffer layer 64, wherein the thickness of the n-type lower cladding layer 66 is between 0.5 and 1 $\mu$m. Further, an n-type AlGaInP lower confining layer 76 is formed on the n-type lower cladding layer 66, wherein a dopant concentration of the lower confining layer 76 is between $5\times10^{16}$/c.c. and $3\times10^{18}$/c.c. and the thickness is between 0.05 and 0.1 $\mu$m. Next, a periodic-delta-doped AlGaInP active layer 68 is formed on the lower confining layer 76. The active layer 68 is formed by alternately stacking 25 layers of quantum well layers 72 and 25 layers of barrier layers 74, wherein Te dopant with a dopant concentration between $5\times10^{16}$/c.c. and $3\times10^{18}$/c.c. is doped in each barrier layer 74. Each quantum well layer 72 is an undoped AlGaInP layer. Next, an n-type AlGaInP upper confining layer 78 is formed on the active layer 68, wherein a dopant concentration of the upper confining layer 78 is between $5\times10^{16}$/c.c. and $3\times10^{18}$/c.c. and the thickness is between 0.05 and 0.1 $\mu$m. Next, a p-type AlInP upper cladding layer 70 is formed on the upper confining layer 78, wherein the thickness of the p-type upper cladding layer 70 is 0.5 $\mu$m. Lastly, a p-type GaP window layer 80 with a thickness of 8 $\mu$m is formed on the p-type upper cladding layer 70.

EXAMPLE 2

Figure 9:
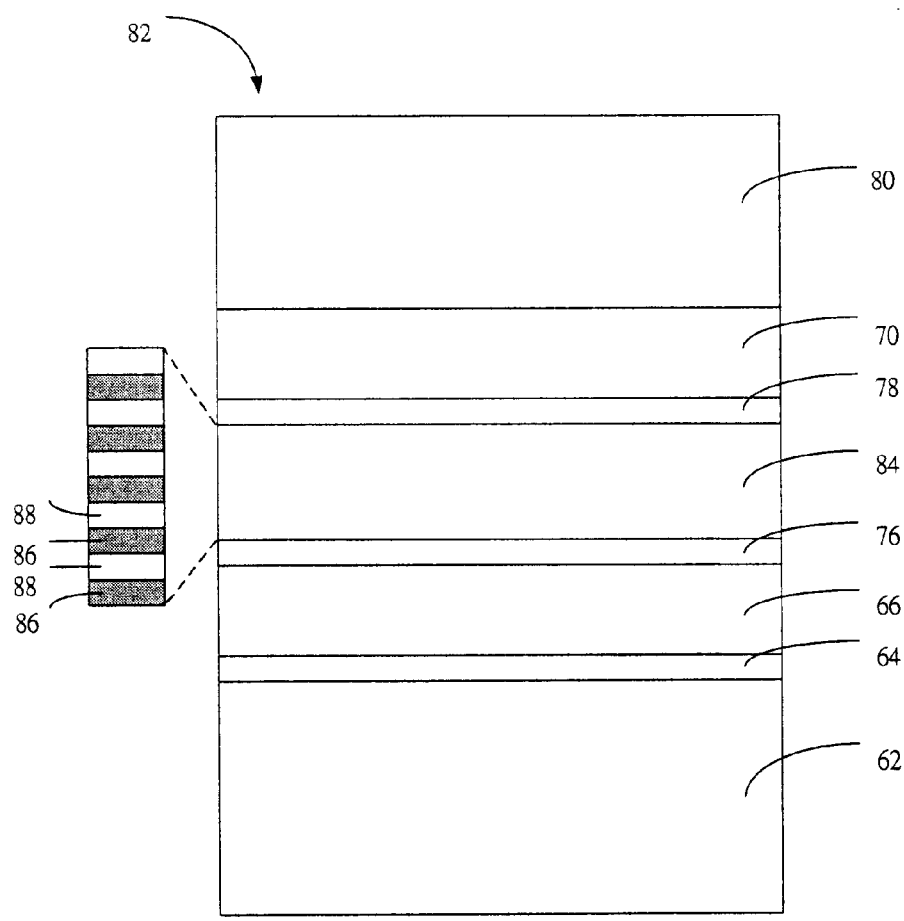
FIG. 9 is a schematic diagram of a light emitting diode according to the second embodiment.

Please refer to FIG. 9. FIG. 9 is a schematic diagram of a light emitting diode 82 of the second embodiment. The light emitting diode 82 is formed on a GaAs substrate 62 which has a (100) principal crystal plane inclined at −2 or +2 degree to (111) plane and has an n-type dopant concentration of $1×10^{18}$/c.c. The thickness of the GaAs substrate 62 is bout 350 μm. Firstly, a GaAs buffer layer 64 having an n-type dopant concentration of $1×10^{18}$/c.c. is formed on the substrate 62. Secondly, an n-type AlInP lower cladding layer 66 is formed on the buffer layer 64, wherein the thickness of the n-type lower cladding layer 66 is between 0.5 and 1 μm. Further, an n-type AlGaInP lower confining layer 76 is formed on the n-type lower cladding layer 66, wherein a dopant concentration of the lower confining layer 76 is between $5×10^{16}$/c.c. and $3×10^{18}$/c.c. and the thickness is between 0.05 and 0.1 μm. Next, a periodic-delta-doped AlGaInP active layer 84 is formed on the lower confining layer 76. The active layer 84 is formed by alternately stacking 25 layers of quantum well layers 86 and 25 layers of barrier layers 88, wherein a Te dopant with a dopant concentration between $5×10^{16}$/c.c. and $3×10^{18}$/c.c. is doped in each quantum well layer 86. Each barrier layer 88 is an undoped AlGaInP layer. Next, an n-type AlGaInP upper confining layer 78 is formed on the active layer 84, wherein a dopant concentration of the upper confining layer 78 is between $5×10^{16}$/c.c. and $3×10^{18}$/c.c. and the thickness is between 0.05 and 0.1 μm. Next, a p-type AlInP upper cladding layer 70 is formed on the upper confining layer 78, wherein the thickness of the p-type upper cladding layer 70 is 0.5 μm. Lastly, a p-type GaP window layer 80 with a thickness of 8 μm is formed on the p-type upper cladding layer 70.

EXAMPLE 3

Figure 10:
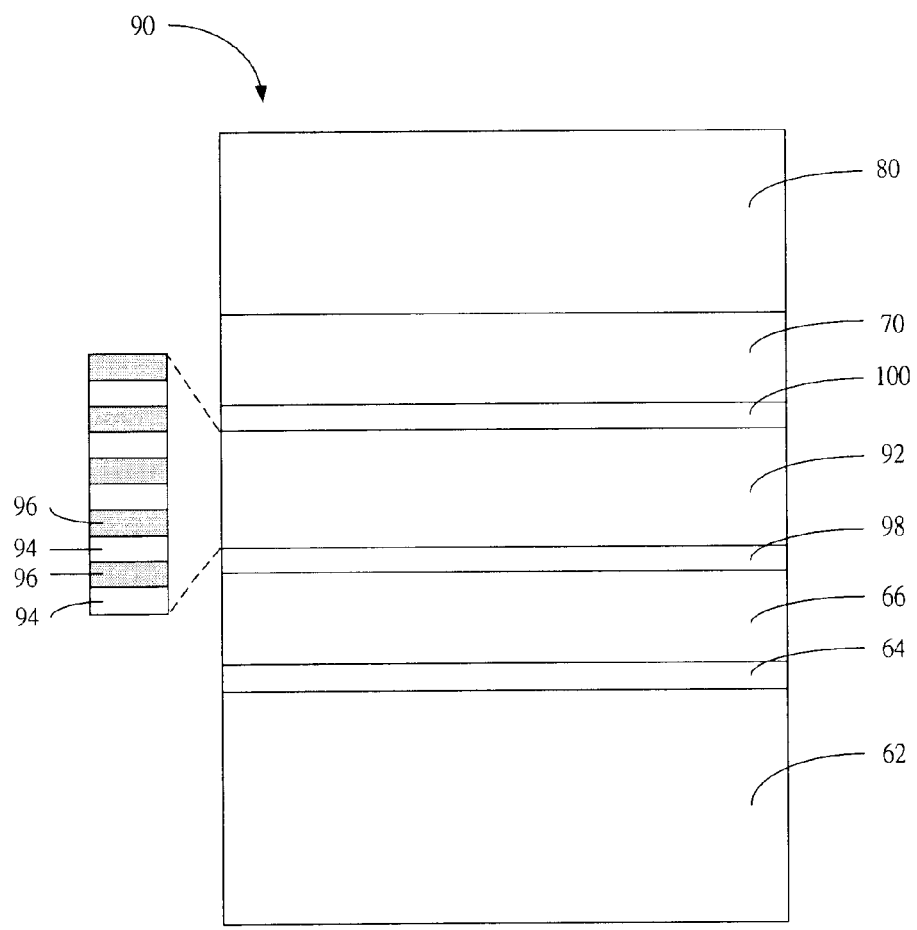
FIG. 10 is a schematic diagram of a light emitting diode according to the third embodiment.

Please refer to FIG. 10. FIG. 10 is a schematic diagram of a light emitting diode 90 of the third embodiment. The light emitting diode 90 is formed on a GaAs substrate 62 which has a (100) principal crystal plane inclined at −2 or +2 degree to (111) plane and has an n-type dopant concentration of $1×10^{18}$/c.c. The thickness of the GaAs substrate 62 is bout 350 μm. Firstly, a GaAs buffer layer 64 having an n-type dopant concentration of $1×10^{18}$/c.c. is formed on the substrate 62. Secondly, an n-type AlInP lower cladding layer 66 is formed on the buffer layer 64, wherein the thickness of the n-type lower cladding layer 66 is between 0.5 and 1 μm. Further, a p-type AlGaInP lower confining layer 98 is formed on the n-type lower cladding layer 66, wherein a dopant concentration of the lower confining layer 98 is between $5×10^{16}$/c.c. and $3×10^{18}$/c.c. and the thickness is between 0.05 and 0.1 μm. Next, a periodic-delta-doped AlGaInP active layer 92 is formed on the lower confining layer 76. The active layer 92 is formed by alternately stacking 25 layers of quantum well layers 94 and 25 layers of barrier layers 96, wherein Mg dopant with a dopant concentration between $5×10^{16}$/c.c. and $3×10^{18}$/c.c. is doped in each barrier layer 96. Each quantum well layer 94 is an undoped AlGaInP layer. Next, a p-type AlGaInP upper confining layer 100 is formed on the active layer 92, wherein a dopant concentration of the upper confining layer 100 is between $5×10^{16}$/c.c. and $3×10^{18}$/c.c. and the thickness is between 0.05 and 0.1 μm. Next, a p-type AlInP upper cladding layer 70 is formed on the upper confining layer 78, wherein the thickness of the p-type upper cladding layer 70 is 0.5 μm. Lastly, a p-type GaP window layer 80 with a thickness of 8 μm is formed on the p-type upper cladding layer 70.

EXAMPLE 4

Figure 11:
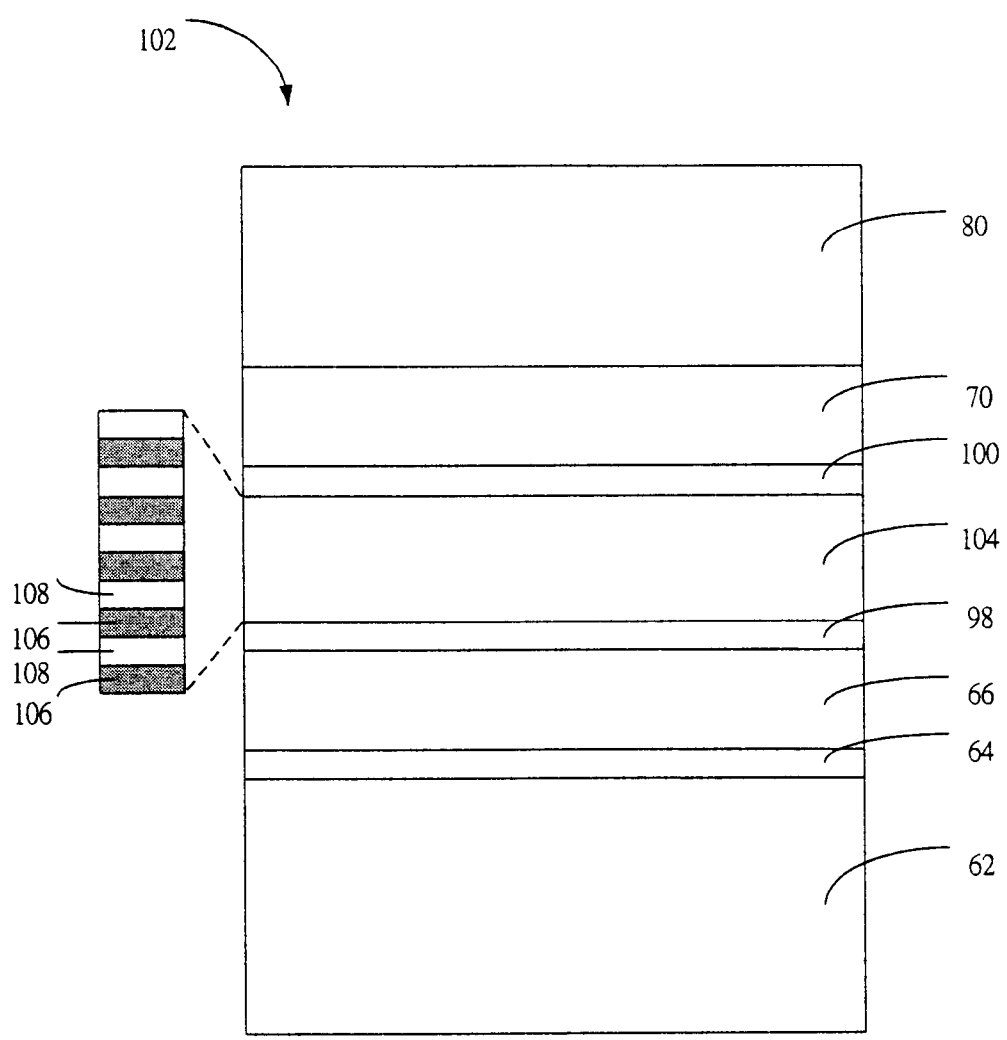
FIG. 11 is a schematic diagram of a light emitting diode according to the fourth embodiment.

Please refer to FIG. 11. FIG. 11 is a schematic diagram of a light emitting diode 102 of the fourth embodiment. The light emitting diode 102 is formed on a GaAs substrate 62 which has a (100) principal crystal plane inclined at −2 or +2 degree to (111) plane and has an n-type dopant concentration of $1×10^{18}$/c.c. The thickness of the GaAs substrate 62 is bout 350 μm. Firstly, a GaAs buffer layer 64 having an n-type dopant concentration of $1×10^{18}$/c.c. is formed on the substrate 62. Secondly, an n-type AlInP lower cladding layer 66 is formed on the buffer layer 64, wherein the thickness of the n-type lower cladding layer 66 is between 0.5 and 1 μm. Further, a p-type AlGaInP lower confining layer 98 is formed on the n-type lower cladding layer 66, wherein a dopant concentration of the lower confining layer 98 is between $5×10^{16}$/c.c. and $3×10^{18}$/c.c. and the thickness is between 0.05 and 0.1 μm. Next, a periodic-delta-doped AlGaInP active layer 104 is formed on the lower confining layer 98. The active layer 104 is formed by alternately stacking 25 layers of quantum well layers 106 and 25 layers of barrier layers 108, wherein Mg dopant with a dopant concentration between $5×10^{16}$/c.c. and $3×10^{18}$/c.c. is doped in each quantum well layer 106. Each barrier layer 108 is an undoped AlGaInP layer. Next, a p-type AlGaInP upper confining layer 100 is formed on the active layer 104, wherein a dopant concentration of the upper confining layer 100 is between $5×10^{16}$/c.c. and $3×10^{18}$/c.c. and the thickness is between 0.05 and 0.1 μm. Next, a p-type AlInP upper cladding layer 70 is formed on the upper confining layer 100, wherein the thickness of the p-type upper cladding layer 70 is 0.5 μm. Lastly, a p-type GaP window layer 80 with a thickness of 8 μm is formed on the p-type upper cladding layer 70.

Comparing to the conventional quantum well device 10, the quantum well device 30 of the present invention adopts periodic-delta-doped active layers 38, 68, 84, 92 and 104, wherein a plurality of quantum well layers 42 and a plurality of barrier layers 44 are selectively and alternately doped with an n-type or p-type dopant of a predetermined dopant concentration ($5×10^{16}$/c.c. to $3×10^{18}$/c.c.). Since the n-type or p-type dopant of the predetermined concentration can be applied to control the breakdown voltage and emitting light intensity of the quantum well device 30, failure resulted from ESD of the quantum well device 30 will be greatly reduced under acceptable emitting light intensity and consequently reliability of the quantum well device 30 is enhanced. Further, each structure layer of the quantum well device 30 of the present invention can be grown by adopting the metal organic vapor phase epitaxy (MOVPE) method and the preparation of an ESD passivation layer for avoiding ESD failure is needless. Therefore, the quantum well device 30 of the present invention is relatively simple in process and low in production cost.

The above detailed description of the preferred embodiments is intended to describe features and spirits of the present invention more clearly. However, the disclosed preferred embodiments are not to limit the scope of the invention. On the contrary, the above description and various changes and equivalent arrangements are intended to be protected within the invention. Therefore, the claimed scope of the invention shall be interpreted in a broadest way on the basis of the above description and shall cover all possible equivalent changes and arrangements.

What is claimed is:

1. An AlGaInP quantum well device with an electrostatic discharge (ESD) endurance, comprising:
   a first conductivity type GaAs substrate;
   a first conductivity type GaAs buffer layer formed on the first conductivity type GaAs substrate;
   a first conductivity type AlGaInP lower cladding layer formed on the first conductivity type GaAs buffer layer;

an AlGaInP lower confining layer formed on the first conductivity type AlGaInP lower cladding layer;

an active layer with the ESD endurance formed on the AlGaInP lower confining layer, the active layer comprising alternately stacked n layers of AlGaInP quantum well layers and n layers of AlGaInP barrier layers, wherein the AlGaInP quantum well layers are doped with an n-type dopant while the AlGaInP barrier layers are undoped, and n is a positive integer;

an AlGaInP upper confining layer formed on the active layer;

a second conductivity type AlGaInP upper cladding layer formed on the AlGaInP upper confining layer; and a second conductivity type covering layer formed on the second conductivity type AlGaInP upper cladding layer.

2. The AlGaInP quantum well device of claim 1, wherein the n-type dopant is selected from a group consisting of Te, Se or Si.

3. The AlGaInP quantum well device of claim 1, wherein a concentration of the n-type dopant is between $5 \times 10^{16}$/c.c. and $3 \times 10^{18}$ c.c.

4. An AlGaInP quantum well device with an electrostatic discharge (ESD) endurance, comprising:

a first conductivity type GaAs substrate;

a first conductivity type GaAs buffer layer formed on the first conductivity type GaAs substrate;

a first conductivity type AlGaInP lower cladding layer formed on the first conductivity type GaAs buffer layer;

an AlGaInP lower confining layer formed on the first conductivity type AlGaInP lower cladding layer;

an active layer with the ESD endurance formed on the AlGaInP lower confining layer, the active layer comprising alternately stacked n layers of AlGaInP quantum well layers and n layers of AlGaInP barrier layers, wherein the AlGaInP quantum well layers are doped with a p-type dopant while the AlGaInP barrier layers are undoped, and n is a positive integer;

an AlGaInP upper confining layer formed on the active layer;

a second conductivity type AlGaInP upper cladding layer formed on the AlGaInP upper confining layer; and a second conductivity type covering layer formed on the second conductivity type AlGaInP upper cladding layer.

5. The AlGaInP quantum well device of claim 4, wherein the p-type dopant is selected from a group consisting of Mg, C or Zn.

6. The AlGaInP quantum well device of claim 4, wherein a concentration of the p-type dopant is between $5 \times 10^{16}$/c.c. and $3 \times 10^{18}$/c.c.

* * * * *